(12) United States Patent
Dong et al.

(10) Patent No.: US 11,456,444 B2
(45) Date of Patent: Sep. 27, 2022

(54) DISPLAY PANEL, MANUFACTURING METHOD THEREOF, DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Wanli Dong, Beijing (CN); Youngyik Ko, Beijing (CN)

(73) Assignees: Beijing BOE Technology Development Co., Ltd., Beijing (CN); Chengdu BOE Optoelectronics Technology Co., Ltd., Sichuan (CN)

(*) Notice: Subject to any disclaimer, the term of this patent is extended or adjusted under 35 U.S.C. 154(b) by 757 days.

(21) Appl. No.: 16/305,928

(22) PCT Filed: Mar. 6, 2018

(86) PCT No.: PCT/CN2018/078123
§ 371 (c)(1),
(2) Date: Nov. 30, 2018

(87) PCT Pub. No.: WO2019/001002
PCT Pub. Date: Jan. 3, 2019

(65) Prior Publication Data
US 2021/0234133 A1    Jul. 29, 2021

(30) Foreign Application Priority Data
Jun. 28, 2017   (CN) .......................... 201710506817.X

(51) Int. Cl.
*H01L 51/52* (2006.01)
*G02F 1/1335* (2006.01)
(Continued)

(52) U.S. Cl.
CPC .... *H01L 51/5284* (2013.01); *G02F 1/133512* (2013.01); *H01L 51/56* (2013.01);
(Continued)

(58) Field of Classification Search
CPC ... H01L 51/5284; H01L 51/56; H01L 27/323; H01L 27/3258; H01L 2227/323;
(Continued)

(56) References Cited

U.S. PATENT DOCUMENTS

2006/0235060 A1* 10/2006 Yoshida .............. C07D 307/77
                                                             514/366
2015/0242029 A1*  8/2015 Kim .................... G06F 3/03545
                                                             345/173
(Continued)

FOREIGN PATENT DOCUMENTS

CN    1908704 A    2/2007
CN    107256881 A   10/2017

OTHER PUBLICATIONS

English Machine Translation of CN 1908704 (Year: 2007).*
Search Report and Written Opinion for International Patent Application No. PCT/CN2018/078123 dated May 22, 2018.

*Primary Examiner* — Dzung Tran
(74) *Attorney, Agent, or Firm* — Calfee, Halter & Griswold LLP

(57) ABSTRACT

A display panel, a method for manufacturing the same, and a display device including the display panel are provided. The display panel includes a pixel array and a pigment mixing layer, the pigment mixing layer being located between a pixel driving layer and a light emitting surface of the display panel. The pigment mixing layer includes a mixture formed by a first pigment that absorbs red light, a second pigment that absorbs green light, and a third pigment that absorbs blue light. A proportion of the first pigment in the mixture is 15% to 20%, a proportion of the second
(Continued)

pigment in the mixture is 50% to 80%, and a proportion of the third pigment in the mixture is 5% to 20%.

10 Claims, 2 Drawing Sheets

(51) Int. Cl.
 *H01L 51/56* (2006.01)
 *G02F 1/1333* (2006.01)
 *H01L 27/32* (2006.01)
 *H01L 51/00* (2006.01)

(52) U.S. Cl.
 CPC ........ *G02F 1/13338* (2013.01); *H01L 27/323* (2013.01); *H01L 27/3258* (2013.01); *H01L 51/0096* (2013.01); *H01L 51/5253* (2013.01); *H01L 2227/323* (2013.01)

(58) Field of Classification Search
 CPC ............. H01L 51/0096; H01L 51/5253; G02F 1/133512; G02F 1/13338
 USPC .......................................................... 257/40
 See application file for complete search history.

(56) References Cited

U.S. PATENT DOCUMENTS

| | | | |
|---|---|---|---|
| 2016/0109980 A1* | 4/2016 | Lee | G02F 1/1368 345/174 |
| 2017/0012085 A1* | 1/2017 | Lee | H01L 27/3244 |
| 2017/0185200 A1* | 6/2017 | Dai | G06F 3/04164 |
| 2017/0307923 A1* | 10/2017 | Hwang | G02F 1/13338 |
| 2017/0364171 A1* | 12/2017 | You | G06F 3/0445 |
| 2018/0182821 A1* | 6/2018 | Yun | G06F 3/0443 |

* cited by examiner

DISPLAY PANEL, MANUFACTURING METHOD THEREOF, DISPLAY DEVICE

RELATED APPLICATION

The present application is the U.S. national phase entry of PCT/CN2018/078123, with an international filling date of Mar. 6, 2018, which claims the benefit of Chinese Patent Application No. 201710506817.X, filed on Jun. 28, 2017, the entire disclosures of which are incorporated herein by reference.

TECHNICAL FIELD

The present disclosure relates to the field of display technologies, and particularly to a display panel, a display device, and a method for manufacturing a display panel.

BACKGROUND

Various display devices such as liquid crystal displays (LCDs), organic light emitting diode (OLED) displays, and the like have been widely used in people's daily work and life, and these display devices may operate under various ambient lighting conditions. Indoor environments generally have relatively low ambient illumination, thus the display device requires lower-level display brightness, while outdoor applications are usually in an environment with higher ambient illumination, the display device is required to have higher-level display brightness and low reflection. However, it is difficult to design a display device having a suitable contrast for ambient lighting conditions varying in a wide range. Some of the components inside a display device tend to have a reflective property, which may produce a strong reflection of ambient light in high-intensity ambient lighting environments. For example, conductive electrodes in an OLED display are typically formed of a highly reflective metallic material. They reflect ambient light to a viewer of the display device, affecting the viewing experience of the viewer. In addition, the pixel driving layer in the display device is also reflective. In this regard, a conventional solution is to provide a polarizing plate and a quarter wave plate in the display device. The polarizing plate polarizes the ambient light incident onto the display, and the quarter wave plate rotates the polarization direction of the polarized light by 45 degrees. Any polarized light that is reflected back through the quarter wave plate is then further rotated by 45 degrees so that the polarization direction of the polarized light is perpendicular to the polarizing plate, and therefore, the reflected light is substantially absorbed by the polarizing plate, thereby improving the contrast of the display device.

SUMMARY

Inventors of the application have found that the conventional solution to improve the viewing effect of a display device of employing an optical structure that includes a polarizer and a quarter wave plate has a disadvantage. Specifically, these optical structures have a large thickness (typically greater than 120 microns), and the optical mechanism causes the transmittance of light from pixels inside the display device to be low (often less than 45%), affecting the visual brightness of the display device to the viewer. In addition, the optical structure including a polarizer and a quarter wave plate has a high hardness, which is not suitable for the production of a flexible display device. Accordingly, embodiments of the disclosure are directed to providing an improved solution that can increase the contrast of a display device.

A display panel proposed by the embodiments of the disclosure comprises a pixel array, and further comprises a pigment mixing layer, the pigment mixing layer being located between the pixel driving layer and the light emitting surface of the display panel. The pigment mixing layer includes a mixture formed by a first pigment that absorbs red light, a second pigment that absorbs green light, and a third pigment that absorbs blue light, a proportion of the first pigment in the mixture being 15% to 20%, a proportion of the second pigment in the mixture being 50% to 80%, a proportion of the third pigment in the mixture being 5% to 20%.

According to some embodiments of the present disclosure, the display panel further comprises a transparent substrate directly carrying the pigment mixing layer.

According to some embodiments of the present disclosure, the pigment mixing layer has a thickness from 20 μm to 60 μm, and the transparent substrate has a thickness from 5 μm to 30 μm.

According to some embodiments of the present disclosure, a material of the transparent substrate includes polyethylene naphthalate.

According to some embodiments of the present disclosure, the display panel is an OLED display panel, the transparent substrate and the pigment mixing layer being located above an organic light emitting layer.

Further, according to some embodiments of the present disclosure, the OLED display panel further comprises a touch electrode layer and a cover glass, the transparent substrate and the pigment mixing layer being located between the touch electrode layer and the cover glass.

According to some embodiments of the present disclosure, the OLED display panel further comprises a thin film encapsulation for protecting the organic light emitting layer, the transparent substrate and the pigment mixing layer being adjacent to the thin film encapsulation.

According to some embodiments of the present disclosure, the display panel is an LCD panel, the pigment mixing layer being located above a color filter substrate of the LCD panel.

Another embodiment of the present disclosure further provides a display device, the display device comprising the display panel described in any of the foregoing embodiments.

A further embodiment of the present disclosure further provides a method for manufacturing a display panel. The method may comprise steps of:

fabricating a pixel driving layer of the display panel; fabricating a pigment mixing layer, the pigment mixing layer including a mixture formed by a first pigment that absorbs red light, a second pigment that absorbs green light, and a third pigment that absorbs blue light, a proportion of the first pigment in the mixture ranging from 15% to 20%, a proportion of the second pigment in the mixture ranging from 50% to 80%, a proportion of the third pigment in the mixture ranging from 5% to 20%, the pigment mixing layer being located between a pixel driving layer and a light emitting surface of the display panel.

According to some embodiments of the present disclosure, the step of fabricating a pigment mixing layer includes: uniformly mixing the first pigment, the second pigment and the third pigment in proportion to obtain a pigment mixture;

and coating the pigment mixture on a transparent substrate to form a pigment mixing layer on a surface of the transparent substrate.

According to some embodiments of the present disclosure, the pigment mixing layer has a thickness from 20 μm to 60 μm, and the transparent substrate has a thickness from 5 μm to 30 μm.

According to some embodiments of the present disclosure, the method for manufacturing a display panel further comprises: prior to fabricating the pigment mixing layer, adhering, using an optical adhesive, a surface of the transparent substrate opposite to the surface on which the pigment mixing layer is to be formed to a first carrier glass; and after the pigment mixing layer is formed, adhering, using an optical adhesive, a first cover film to a surface of the pigment mixing layer.

According to some embodiments of the present disclosure, the method for manufacturing a display panel further comprises: forming, on a base substrate, the pixel driving layer, an organic light emitting layer, and a thin film encapsulation for protecting the organic light emitting layer, successively; and peeling off the first carrier glass from the transparent substrate, and adhering the surface of the transparent substrate opposite to the surface on which the pigment mixing layer is formed to the thin film encapsulation.

According to some embodiments of the present disclosure, the method for manufacturing a display panel further comprises: peeling off the first cover film from the pigment mixing layer, and forming a touch electrode layer and an encapsulation cover over the pigment mixing layer.

Further, for the base substrate and the transparent substrate mentioned in the above embodiments, the material of the base substrate includes polyimide, and the material of the transparent substrate includes polyethylene naphthalate.

It will be appreciated by those skilled in the art that the features of the embodiments described above can be combined in various ways to form many additional different embodiments.

DETAILED DESCRIPTION OF EMBODIMENTS

Figure 1:
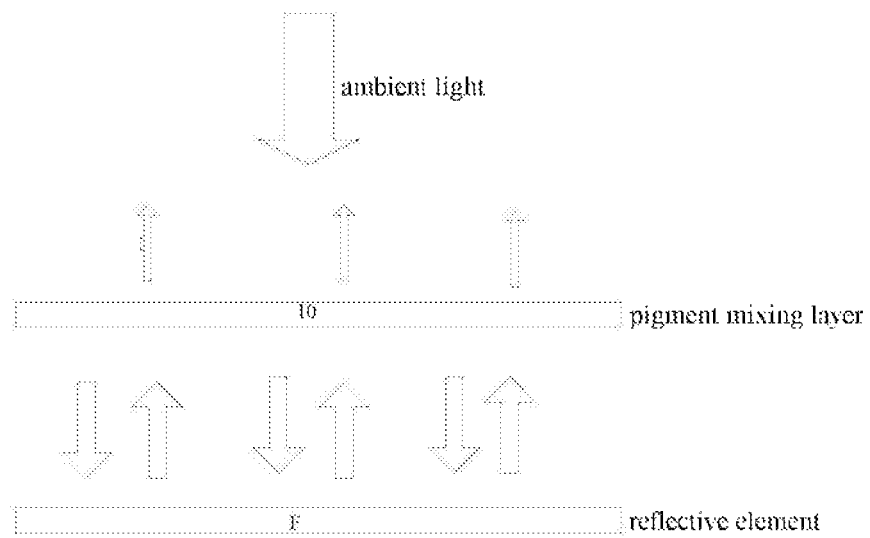
FIG. 1 schematically illustrates a process that external ambient light arrives in the interior of the display panel through the pigment mixing layer and then leaves through the pigment mixing layer again.

Now, embodiments of the disclosure will be described in detail, examples of which are illustrated in the accompanying drawings. Wherever possible, the same reference numerals are used in the drawings and the specification to refer to the same or similar components.

An embodiment of the present disclosure provides a display panel applicable to a display device. The display panel comprises a pixel array composed of a plurality of pixels, and further comprises a pigment mixing layer. The pigment mixing layer is located between a pixel driving layer and a light emitting surface of the display panel, and the pigment mixing layer comprises a mixture formed by a first pigment that absorbs red light, a second pigment that absorbs green light, and a third pigment that absorbs blue light. The proportion of the first pigment in the mixture ranges from 15% to 20%, the proportion of the second pigment in the mixture ranges from 50% to 80%, and the proportion of the third pigment in the mixture ranges from 5% to 20%.

The "pixel driving layer" referred to herein refers to a structure in the display panel for driving the pixels to emit light. For example, for an OLED display panel, the pixel driving layer may include an OLED pixel driving circuit, and the OLED pixel driving layer may include a switching transistor and a driving transistor electrically connected to an organic light emitting unit. For an LCD panel, the pixel driving layer may include a pixel driving circuit on the array substrate in the LCD panel.

For the embodiments of the present disclosure, by using a pigment mixing layer including the first pigment, the second pigment and the third pigment in specific proportions in place of the polarizing plate and the quarter wave plate, not only the reflection effect of the display panel on the ambient light can be significantly reduced to improve the viewer's visual effect, but also the transmittance of light of pixels inside the display panel can be further increased. In addition, compared to the conventional technical solution that employs a polarizing plate and a quarter wave plate, the complicated process required for manufacturing the polarizer can be avoided, which in turn reduces the cost of the display panel. Further, the pigment mixing layer is also more advantageous for the implementation of a flexible display panel.

In order to better understand the embodiments of the present disclosure, first, the principle that the display panel proposed by the embodiment of the disclosure can reduce the reflection of ambient light is briefly described. FIG. 1 schematically shows a process that external ambient light goes into the interior of the display panel through the pigment mixing layer and then leaves through the pigment mixing layer again. As shown in FIG. 1, various reflective elements in the display panel are illustrated as a layer structure F. The external ambient light is incident onto a pigment mixing layer 10. Part of the ambient light is absorbed by the pigment mixing layer 10, and the remaining light transmits through the pigment mixing layer. Light transmitting through the pigment mixing layer 10 is reflected by a reflective element F inside the display panel, and then light reflected by the reflective element F transmits through the pigment mixing layer 10 again, at which time the pigment mixing layer 10 reabsorbs part of the reflected light. Therefore, the ambient light may experience two absorption processes performed by the pigment mixing layer 10 from entering the display panel to leaving the display panel, and finally, the ambient light exiting from the pigment mixing layer 10 is significantly weakened. In this way, reflection of the ambient light by the display panel is greatly reduced, thereby improving the contrast of the display device to which the display panel is applied.

The first pigment that absorbs red light, the second pigment that absorbs green light, and the third pigment that absorbs blue light as mentioned in the embodiments herein may include any material known to those skilled in the art capable of absorbing light of a corresponding color. The materials are known to those skilled in the art, which will not be defined herein.

It can be well understood that the ambient light external to the display device is usually white light, and white light refers to a thickness of the formed pigment mixing layer, the "ratio of brightness" refers to the ratio of red light (R), green light (G) or blue light (B) in the ambient light in terms of brightness under the conditions of the experiment, the "intensity of absorption" refers to the ratio (absorption degree) of red light, green light or blue light in the ambient light which is absorbed by the pigment mixing layer, and the "transmittance" refers to a transmittance of the pigment mixing layer to light of pixels of the display panel.

TABLE 1

| | Proportion of pigment | | | Ratio of brightness | | | Intensity of absorption | | | |
|---|---|---|---|---|---|---|---|---|---|---|
| Thickness | First pigment | Second pigment | Third pigment | R | G | B | R | G | B | Transmittance |
| 20 μm | 20% | 70% | 10% | 24.0% | 69.4% | 6.6% | 17.0% | 63.0% | 8.0% | 68.52% |
| 40 μm | 20% | 70% | 10% | 24.0% | 69.4% | 6.6% | 19.55% | 69.3% | 9.6% | 65.33% |
| 60 μm | 20% | 70% | 10% | 24.0% | 69.4% | 6.6% | 19.93% | 69.93% | 9.92% | 65.00% |
| 20 μm | 15% | 80% | 5% | 24.0% | 69.4% | 6.6% | 12.75% | 72.00% | 4.00% | 59.55% |
| 40 μm | 15% | 80% | 5% | 24.0% | 69.4% | 6.6% | 14.66% | 79.20% | 4.8% | 55.48% |
| 60 μm | 15% | 80% | 5% | 24.0% | 69.4% | 6.6% | 14.95% | 79.92% | 4.96% | 55.07% | can be regarded as a mixture of light with three primary colors of red (R), green (G) and blue (B). Accordingly, the first pigment that absorbs red light, the second pigment that absorbs green light, and the third pigment that absorbs blue light in the pigment mixing layer absorb red light, green light, and blue light in the ambient light respectively, thereby reducing ambient light reflected from the display panel and perceived by the human eyes.

The pigment mixing layer 10 may have certain influence on the transmittance for the backlight of the display panel or light emitted from the pixels. To this end, the inventors of the application conducted an experimental study to determine the degree of influence of the pigment mixing layer on the transmittance of light from pixels of the display panel. Surprisingly, however, although the pigment mixture layer has some influence on the transmittance of light from pixels of the display panel, under certain conditions, such influence is less than that caused by the conventional optical structure including a polarizing plate and a quarter wave plate on the transmittance of light from pixels. It has been found through experimentation that forming a pigment mixing layer by mixing the first pigment, the second pigment and the third pigment in the following proportions can significantly reduce absorption of light from pixels by the formed pigment mixing layer: 15% to 20% of the first pigment, 50% to 80% of the second pigment and 5% to 20% of the third pigment. Moreover, the transmittance of the pigment mixing layer formed by mixing the first pigment, the second pigment, and the third pigment in the above proportions to light of pixels (e.g. light from an OLED) may reach or even exceed 50%. While the transmittance of the conventional optical structure including a polarizing plate and a quarter wave plate to light of pixels is typically in the range of 42% to 45%. Therefore, the pigment mixing layer provided by embodiments of the present disclosure can not only act as an anti-reflection layer for the ambient light, but also increase the transmittance of the display panel to light from its internal pixels, reducing loss of light of pixels.

Table 1 below lists some experimental data, and the experiment is based on a white organic light emitting diode (WOLED) display panel in which the light emitting device is an OLED that emits white light. In Table 1, the thickness It can be seen from the experimental data of Table 1 that the pigment mixing layer formed by mixing the first pigment, the second pigment and the third pigment according to the proportional ranges proposed in the above embodiment can absorb red light, green light and blue light in the ambient light to a great extent, and the transmittance of the pigment mixing layer to light of pixels inside the display panel is higher than 50%. In particular, for a pigment mixing layer including 20% of the first pigment, 70% of the second pigment and 10% of the third pigment, its transmittance to light of the pixels inside the display panel may be higher than 65%, and its absorption to red light, green light and blue light in the ambient light is higher. In the corresponding embodiment of Table 1, the thickness of the pigment mixing layer ranges from 20 μm to 60 μm, which further reduces the thickness of the display panel as compared to the conventional optical structure (the thickness thereof is usually greater than 120 μm) including a polarizing plate and a quarter wave plate. Although the experiment corresponding to Table 1 is based on a WOLED display panel, the pigment mixing layer described in the embodiments of the disclosure is also applicable to a display panel including an RGB organic light emitting element.

In addition, compared to the conventional technical solution that employs a polarizing plate and a quarter wave plate, the complicated process required for manufacturing the polarizing plate can be avoided, which in turn reduces the cost of the display panel. Moreover, the polarizing plate usually has a high hardness and is easily broken when bent, and the pigment mixing layer is much better than the polarizing plate in toughness. Therefore, the pigment mixing layer proposed by embodiments of the present disclosure is more advantageous for the implementation of a flexible display panel.

For the pigment mixing layer in the display panel proposed in embodiments of the disclosure, it may be formed on any appropriate layer structure of the display panel as long as the pigment mixing layer is located between the pixel driving layer and the light emitting surface of the display panel. For example, for an OLED display panel, the pigment mixing layer may be formed on a thin film encapsulation (TFE) that protects the organic light emitting layer in the OLED display panel.

Figure 2:
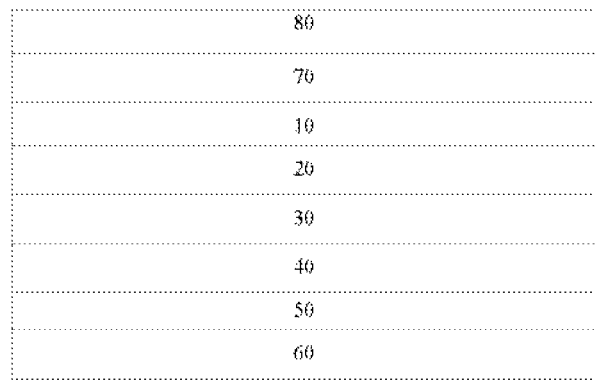
FIG. 2 schematically illustrates a sectional view of an OLED display panel according to an embodiment of the present disclosure.

FIG. 2 shows a schematic sectional view of a display panel according to an embodiment. In this example, the display panel is an OLED display panel. As shown in FIG. 2, the pigment mixing layer 10 is arranged on a transparent substrate 20 having a thickness of 5 μm to 30 μm. For the 20 μm to 60 μm thick pigment mixing layer 10 and the 5 μm to 30 μm thick transparent substrate 20, the total thickness thereof does not exceed 90 μm, which is still smaller than the thickness of the conventional optical structure including a polarizing plate and a quarter wave plate. The material of the transparent substrate 20 may be any suitable material having high light transmittance, including but not limited to polyethylene naphthalate (PEN). For the transparent substrate 20 formed of polyethylene naphthalate, its combination with the pigment mixing layer is more advantageous for the implementation of a flexible display panel.

In the example shown in FIG. 2, the display panel further comprises a base substrate 60, a pixel driving layer (e.g., thin film transistor TFTs) 50, an organic light emitting layer 40, and a thin film encapsulation 30. The thin film encapsulation 30 can block water and oxygen, so that the organic light emitting layer is prevented from being eroded by external water and oxygen. The display panel may further comprise a touch electrode layer 70 and a cover glass 80, and the touch electrode layer 70 may achieve a touch function for the display panel. In the example shown in FIG. 2, the pigment mixing layer 10 and the transparent substrate 20 are located above the thin film encapsulation 30. Alternatively, the pigment mixing layer 10 and the transparent substrate 20 may be below the thin film encapsulation 30 but above the organic light emitting layer 40. Therefore, the pigment mixing layer 10 and the transparent substrate 20 may be disposed adjacent to the thin film encapsulation 30. In other embodiments, the pigment mixing layer and the transparent substrate may be located between the touch electrode layer and the cover glass.

It can be understood that the technical concept revealed by the embodiments herein can be applied to an LCD panel. In the embodiment of an LCD panel, the pigment mixing layer may be on the color filter substrate of the LCD panel.

Accordingly, another embodiment of the present disclosure provides a display device comprising the display panel described in any of the foregoing embodiments of the disclosure. The display device includes, but is not limited to, any product or component having a display function such as a mobile phone, a tablet computer, a television, a display, a notebook computer, a digital photo frame, a navigator, and the like.

Corresponding to the display panel provided by the above embodiments of the present disclosure, a further embodiment of the present disclosure provides a method for manufacturing a display panel. The method for manufacturing a display panel as provided by an embodiment of the disclosure may comprise the following steps: fabricating a pixel driving layer of the display panel; fabricating a pigment mixing layer, the pigment mixing layer including a mixture formed by a first pigment that absorbs red light, a second pigment that absorbs green light, and a third pigment that absorbs blue light. The proportion of the first pigment in the mixture is 15% to 20%, the proportion of the second pigment in the mixture is 50% to 80%, and the proportion of the third pigment in the mixture is 5% to 20%. The pigment mixing layer is located between the pixel driving layer and a light emitting surface of the display panel.

In order to introduce the method for manufacturing a display panel as proposed by the embodiment of the present disclosure more clearly and in detail, the specific process of manufacturing a display panel will be described below by taking the display panel shown in FIG. 2 as an example.

Figure 3:
FIG. 3 schematically illustrates a step involved in the method for manufacturing a display panel as shown in FIG. 2.

As shown in FIG. 3, first, the pixel driving layer 50, the organic light emitting layer 40, and the thin film encapsulation 30 may be made on the base substrate 60 successively. The thin film encapsulation 30 can prevent the organic light emitting layer from being eroded by water and oxygen. It can be understood that the pixel array of the display panel includes the organic light emitting layer 40.

The method for manufacturing a display panel as provided by an embodiment of the present disclosure may further comprise: after or before the step shown in FIG. 3, uniformly mixing the first pigment that absorbs red light, the second pigment that absorbs green light, and the third pigment that absorbs blue light in proportion to obtain a pigment mixture. Specifically, the first pigment, the second pigment, and the third pigment are uniformly mixed in the following proportions: 15% to 20% of the first pigment, 50% to 80% of the second pigment, and 5% to 20% of the third pigment.

Figure 4:
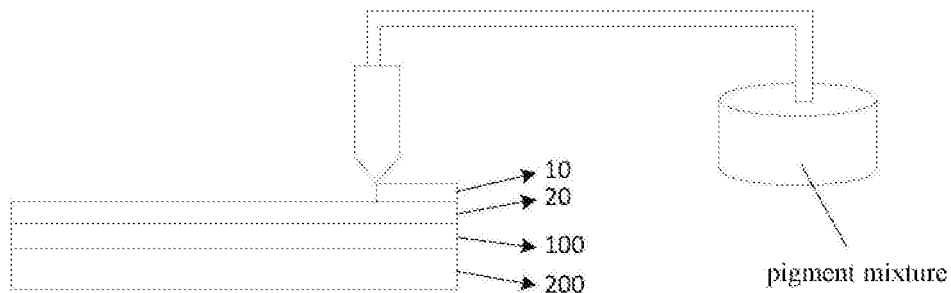
FIG. 4 schematically illustrates a step involved in the method for manufacturing a display panel as shown in FIG. 2.
Figure 5:
FIG. 5 schematically illustrates a step involved in the method for manufacturing a display panel as shown in FIG. 2.

Thereafter, the resulting pigment mixture is coated on the transparent substrate to form a pigment mixing layer on a surface of the transparent substrate. As shown in FIG. 4, the resulting pigment mixture may be attached to the surface of the transparent substrate 20 by screen printing, spin coating or the like. In the embodiment shown in FIG. 4, the pigment mixing layer 10 formed has a thickness of 20 μm to 60 μm, and the transparent substrate 20 has a thickness of 5 μm to 30 μm. According to an embodiment of the disclosure, as shown in FIG. 4, prior to fabricating the pigment mixing layer, a surface of the transparent substrate 20 opposite to the surface on which the pigment mixing layer is to be formed may be adhered to a first carrier glass 200 using an optical adhesive 100. And, after the pigment mixing layer 10 is formed, a first cover film 400 is adhered to the surface of the pigment mixing layer 10 using an optical adhesive 300, as shown in FIG. 5.

Figure 6:
FIG. 6 schematically illustrates a step involved in the method for manufacturing a display panel as shown in FIG. 2.

Thereafter, as shown in FIG. 6, the first carrier glass 200 and the optical adhesive 100 may be peeled off from the transparent substrate 20, and the surface of the transparent substrate 20 opposite to the surface on which the pigment mixing layer is formed is adhered to the thin film encapsulation 30. Next, as shown in FIG. 2, the first cover film 400 and the optical adhesive 300 may be peeled off from the pigment mixing layer, and a touch electrode layer 70 and an encapsulation cover 80 are formed over the pigment mixing layer. At that time, the formed encapsulation cover can play the role of encapsulating and protecting the entire display panel. For the method for manufacturing a display panel as provided by the above embodiment of the disclosure, the material of the base substrate includes, but is not limited to, polyimide, and the material of the transparent substrate includes, but is not limited to, polyethylene naphthalate.

Exemplary embodiments of the disclosure have been described above in detail with reference to the accompanying drawings, but such description is to be considered illustrative or exemplary and not restrictive; the present disclosure is not limited to the described embodiments. The different embodiments described above and in the claims can also be combined. Other variations to the disclosed embodiments can be understood and effected by those skilled in the art in practicing the claimed invention, from a study of the drawings, the specification, and the appended claims. These variations also fall within the scope of the invention.

In the claims, the words such as "includes" or "comprising" do not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A display panel comprising a pixel array, wherein the display panel further comprises a pigment mixing layer, the pigment mixing layer being located between a pixel driving layer and a light emitting surface of the display panel, and the pigment mixing layer including a mixture formed by a first pigment that absorbs red light, a second pigment that absorbs green light, and a third pigment that absorbs blue light, a proportion of the first pigment in the mixture being 15% to 20%, a proportion of the second pigment in the mixture being 50% to 80%, and a proportion of the third pigment in the mixture being 5% to 20%, wherein the display panel further comprises a transparent substrate directly carrying the pigment mixing layer, and wherein the pigment mixing layer has a thickness from 20 μm to 60 μm, and the transparent substrate has a thickness from 5 μm to 30 μm.

2. The display panel according to claim 1, wherein a material of the transparent substrate includes polyethylene naphthalate.

3. The display panel according to claim 1, wherein the display panel is an OLED display panel, the transparent substrate and the pigment mixing layer are located above an organic light emitting layer.

4. The display panel according to claim 3, wherein the OLED display panel further comprises a touch electrode layer and a cover glass, and the transparent substrate and the pigment mixing layer is located between the touch electrode layer and the cover glass.

5. The display panel according to claim 3, wherein the OLED display panel further comprises a thin film encapsulation for protecting the organic light emitting layer, the transparent substrate and the pigment mixing layer being adjacent to the thin film encapsulation.

6. The display panel according to claim 1, wherein the display panel is an LCD panel, the pigment mixing layer being located above a color filter substrate of the LCD panel.

7. A display device comprising a display panel, the display panel comprising a pixel array, wherein the display panel further comprises a pigment mixing layer, the pigment mixing layer being located between a pixel driving layer and a light emitting surface of the display panel, and the pigment mixing layer including a mixture formed by a first pigment that absorbs red light, a second pigment that absorbs green light, and a third pigment that absorbs blue light, a proportion of the first pigment in the mixture being 15% to 20%, a proportion of the second pigment in the mixture being 50% to 80%, and a proportion of the third pigment in the mixture being 5% to 20%, wherein the display panel further comprises a transparent substrate directly carrying the pigment mixing layer, and wherein the pigment mixing layer has a thickness from 20 μm to 60 μm, and the transparent substrate has a thickness from 5 μm to 30 μm.

8. The display device according to claim 7, wherein a material of the transparent substrate includes polyethylene naphthalate.

9. The display device according to claim 7, wherein the display panel is an OLED display panel, the transparent substrate and the pigment mixing layer are located above an organic light emitting layer.

10. The display device according to claim 9, wherein the OLED display panel further comprises a touch electrode layer and a cover glass, the transparent substrate and the pigment mixing layer being located between the touch electrode layer and the cover glass.

* * * * *